United States Patent
De Vos et al.

(10) Patent No.: US 8,830,442 B2
(45) Date of Patent: Sep. 9, 2014

(54) SERVO CONTROL SYSTEM, LITHOGRAPHIC APPARATUS AND CONTROL METHOD

(75) Inventors: Youssef Karel Maria De Vos, Lille (BE); Dirk-Jan Bijvoet, Eindhoven (NL); Ronald Casper Kunst, Geldrop (NL); Ramidin Izair Kamidi, Eindhoven (NL); Khalid Manssouri, Eindhoven (NL)

(73) Assignee: AMSL Netherlands B.V., Veldhoven (NL)

( * ) Notice: Subject to any disclaimer, the term of this patent is extended or adjusted under 35 U.S.C. 154(b) by 1127 days.

(21) Appl. No.: 12/247,411

(22) Filed: Oct. 8, 2008

(65) Prior Publication Data

US 2009/0147236 A1    Jun. 11, 2009

Related U.S. Application Data

(60) Provisional application No. 60/960,646, filed on Oct. 9, 2007.

(51) Int. Cl.
*G03B 27/42* (2006.01)
*G03B 27/58* (2006.01)
*G03B 27/62* (2006.01)
*G03B 27/32* (2006.01)

(52) U.S. Cl.
USPC .................... 355/53; 355/72; 355/75; 355/77

(58) Field of Classification Search
USPC ................ 355/53, 72–77; 378/34; 250/492.1, 250/492.2, 492.22, 493.1, 548; 430/5, 8, 430/22, 30, 311, 312; 356/399–401
See application file for complete search history.

(56) References Cited

U.S. PATENT DOCUMENTS 4,499,546 A * 2/1985 Kuga et al. .................... 700/193
4,686,531 A * 8/1987 Shambroom et al. .......... 324/660
(Continued)

FOREIGN PATENT DOCUMENTS

JP          04302130 A  * 10/1992   ............ H01L 21/027
JP          06-016285 A    1/1994
(Continued)

OTHER PUBLICATIONS

English language Abstract of Japanese Patent Publication No. 06-016285 A, published Jan. 25, 1994, the Japanese Patent Office; 1 page.

(Continued)

*Primary Examiner* — Toan Ton
*Assistant Examiner* — Christina Riddle
(74) *Attorney, Agent, or Firm* — Sterne, Kessler, Goldstein & Fox P.L.L.C

(57) ABSTRACT

A servo control system to control a position of an object supported by a movable support includes a first measurement system to measure a position of the movable support, a comparative device to provide an error signal based on the comparison between a measured movable support position and a desired movable support position, a controller unit to provide a control signal based on the error signal, and an actuator configured to actuate the movable support based on the control signal. The servo control system further includes a slip compensation device to compensate a slip between the object and the movable support, the slip compensation device including a second measurement system to measure an object position with respect to the movable support, and an addition device to add a slip compensation signal to the measured movable support position or the error signal based on the measured object position.

17 Claims, 4 Drawing Sheets

(56) References Cited

U.S. PATENT DOCUMENTS

| | | | |
|---|---|---|---|
| 5,184,055 A * | 2/1993 | Ohishi et al. | 318/615 |
| 5,446,519 A * | 8/1995 | Makinouchi | 355/53 |
| 5,894,056 A * | 4/1999 | Kakizaki et al. | 430/5 |
| 6,141,108 A * | 10/2000 | Kida et al. | 356/401 |
| 6,151,100 A * | 11/2000 | Yamane et al. | 355/53 |
| 6,714,691 B2 | 3/2004 | Outsuka | |
| 6,744,511 B1 * | 6/2004 | Saiki et al. | 356/399 |
| 6,819,425 B2 * | 11/2004 | Kwan | 356/399 |
| 6,946,757 B2 | 9/2005 | Korenaga | |
| 7,280,183 B2 | 10/2007 | Fukui | |
| 7,525,636 B2 | 4/2009 | Bijvoet et al. | |
| 7,884,919 B2 | 2/2011 | Hempenius et al. | |
| 2003/0202166 A1 * | 10/2003 | Takeishi | 355/72 |
| 2005/0117142 A1 * | 6/2005 | Heerens et al. | 355/75 |
| 2007/0099099 A1 * | 5/2007 | Onvlee et al. | 430/30 |
| 2007/0132980 A1 * | 6/2007 | Schoormans et al. | 355/72 |
| 2007/0159616 A1 * | 7/2007 | Van De Ven et al. | 355/75 |
| 2007/0188724 A1 * | 8/2007 | Jacobs et al. | 355/53 |
| 2008/0100819 A1 * | 5/2008 | Onvlee et al. | 355/75 |

FOREIGN PATENT DOCUMENTS

| | | |
|---|---|---|
| JP | 09-246168 A | 9/1997 |
| JP | 10-247618 A | 9/1998 |
| JP | 2000-003855 A | 1/2000 |
| JP | 2004-172557 A | 6/2004 |
| JP | 2005-037914 A | 2/2005 |
| JP | 2005-051197 A | 2/2005 |
| JP | 2006-332519 A | 12/2006 |
| JP | 2007-049056 A | 2/2007 |
| JP | 2007-227911 A | 9/2007 |
| JP | 2009-071305 A | 4/2009 |

OTHER PUBLICATIONS

English language Abstract of Japanese Patent Publication No. 09-246168 A, published Sep. 19, 1997, the Japanese Patent Office; 1 page.

English language Abstract of Japanese Patent Publication No. 10-247618 A, published Sep. 14, 1998, the Japanese Patent Office; 1 page.

English language Abstract of Japanese Patent Publication No. 2000-003855 A, published Jan. 7, 2000, the Japanese Patent Office; 1 page.

English language Abstract of Japanese Patent Publication No. 2004-172557 A, published Jun. 17, 2004, the Japanese Patent Office; 1 page.

English language Abstract of Japanese Patent Publication No. 2005-037914 A, published Feb. 10, 2005, the Japanese Patent Office; 1 page.

English language Abstract of Japanese Patent Publication No. 2005-051197 A, published Feb. 24, 2005, the Japanese Patent Office; 1 page.

English language Abstract of Japanese Patent Publication No. 2006-332519 A, published Dec. 7, 2006, the Japanese Patent Office; 1 page.

English language Abstract of Japanese Patent Publication No. 2007-049056 A, published Feb. 22, 2007, the Japanese Patent Office; 1 page.

English language Abstract of Japanese Patent Publication No. 2007-227911 A, published Sep. 6, 2007, the Japanese Patent Office; 1 page.

English language Abstract of Japanese Patent Publication No. 2009-071305 A, published Apr. 2, 2009, the Japanese Patent Office; 1 page.

English translation of Japanese Notice of Reasons for Rejection directed to related Japanese Patent Application No. 2008-261562, the Japanese Patent Office, mailed Mar. 31, 2011; 6 pages.

* cited by examiner

SERVO CONTROL SYSTEM, LITHOGRAPHIC APPARATUS AND CONTROL METHOD

CROSS-REFERENCE TO RELATED APPLICATION

This application claims the benefit of the filing date of U.S. Provisional Application 60/960,646 filed on Oct. 9, 2007. The subject matter of that application is incorporated herein by reference as if fully set forth herein.

BACKGROUND OF THE INVENTION

1. Field of the Invention

The present invention relates to a servo control system, a lithographic apparatus including a servo control system and a method for controlling the position of an object.

2. Background Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In an embodiment of the scanner-type lithographic apparatus, the patterning device is supported by a patterning device support, which is movable in at least one scanning direction to move the patterning device through the radiation beam. The movement of the patterning device is carried out with high accuracy to avoid overlay errors during acceleration of the movable object To control the positioning of the patterning device support with high accuracy, a servo control system is provided. The servo control system includes a measurement system to measure the actual position of the patterning device support. This actual position which may be measured in one or more directions/degrees of freedom, is subtracted from a set-point position of the patterning device support. The resulting error signal, i.e. the difference between the actual position of the patterning device support and the desired position of the patterning device support is fed into a controller unit which provides a control signal. The control signal is fed into an actuator, which actuator is configured to actuate the patterning device support.

In this known servo control system, it is assumed that during movements of the patterning device support, the patterning device does not move with respect to the patterning device support. However, it has been shown that with increasing accelerations of the patterning device support, there may occur slip between the patterning device support and the patterning device itself. As a result, the positioning of the patterning device support may correctly position a patterning device, when this patterning device is positioned in a nominal position, i.e. the assumed or initial position of the patterning device with respect to the patterning device support. However, when slip occurs between the patterning device and the patterning device support, the patterning device may not be correctly positioned with respect to the projection system although the patterning device is correctly positioned with respect to the projection system. Furthermore, the slip which may occur with a certain acceleration is not constant. Therefore, it may be difficult to predict the slip between the object and the movable support which will be obtained with a certain acceleration/movement of the movable support.

SUMMARY OF THE INVENTION

It is desirable to provide a lithographic apparatus having a movable support configured to support an object, wherein the accuracy of the positioning of the object is less susceptible to slip between the movable support and the object. Further, it is desirable to provide a servo control system which makes positioning of an object supported by a movable support less susceptible to slip between the object and the movable support.

According to an aspect of the invention, there is provided a servo control system to control a position of an object supported by a movable support, including: a first measurement system configured to measure a position of the movable support, a comparative device configured to provide an error signal on the basis of comparison between a measured movable support position and a desired movable support position, a controller unit to provide a control signal on the basis of the error signal, and an actuator configured to actuate the movable support on the basis of the control signal, wherein the servo control system further includes a slip compensation device for compensation of a slip between the object and the movable support, the slip compensation device including a second measurement system to measure a object position with respect to the movable support, and an addition device or adder to add a slip compensation signal to the measured movable support position or the error signal on the basis of the measured object position.

According to an aspect of the invention, there is provided a lithographic apparatus including: an illumination system configured to condition a radiation beam; a patterning device support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the lithographic apparatus includes servo control system to control a position of an object supported by a movable support, including: a first measurement system configured to measure a position of the movable support, a comparative device configured to provide an error signal on the basis of comparison between a measured movable support position and a desired movable support position, a controller unit to provide a control signal on the basis of the error signal, and an actuator configured to actuate the movable support on the basis of the control signal, wherein the servo control system further includes a slip compensation device for compensation of a slip between the object and the movable support, the slip compensation device including a second measurement system to measure a object position with respect to the movable support, and an addition device or adder to add a slip compensation signal to the measured movable support position or the error signal on the basis of the measured object position.

According to an aspect of the invention there is provided a method for controlling the position of an object supported by a movable support, including: measuring a position of the movable support, subtracting the measured movable support position from a desired movable support position to provide an error signal, feeding the error signal to a control unit, the control unit providing a control signal on the basis of the error signal, and feeding the control signal to an actuator configured to actuate the movable support, wherein the method further includes compensating slip between the object and the movable support, the compensating including measuring an object position of the object with respect to the movable support, and adding a slip compensation signal to the measured movable support position or the error signal on the basis of the measured object position.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
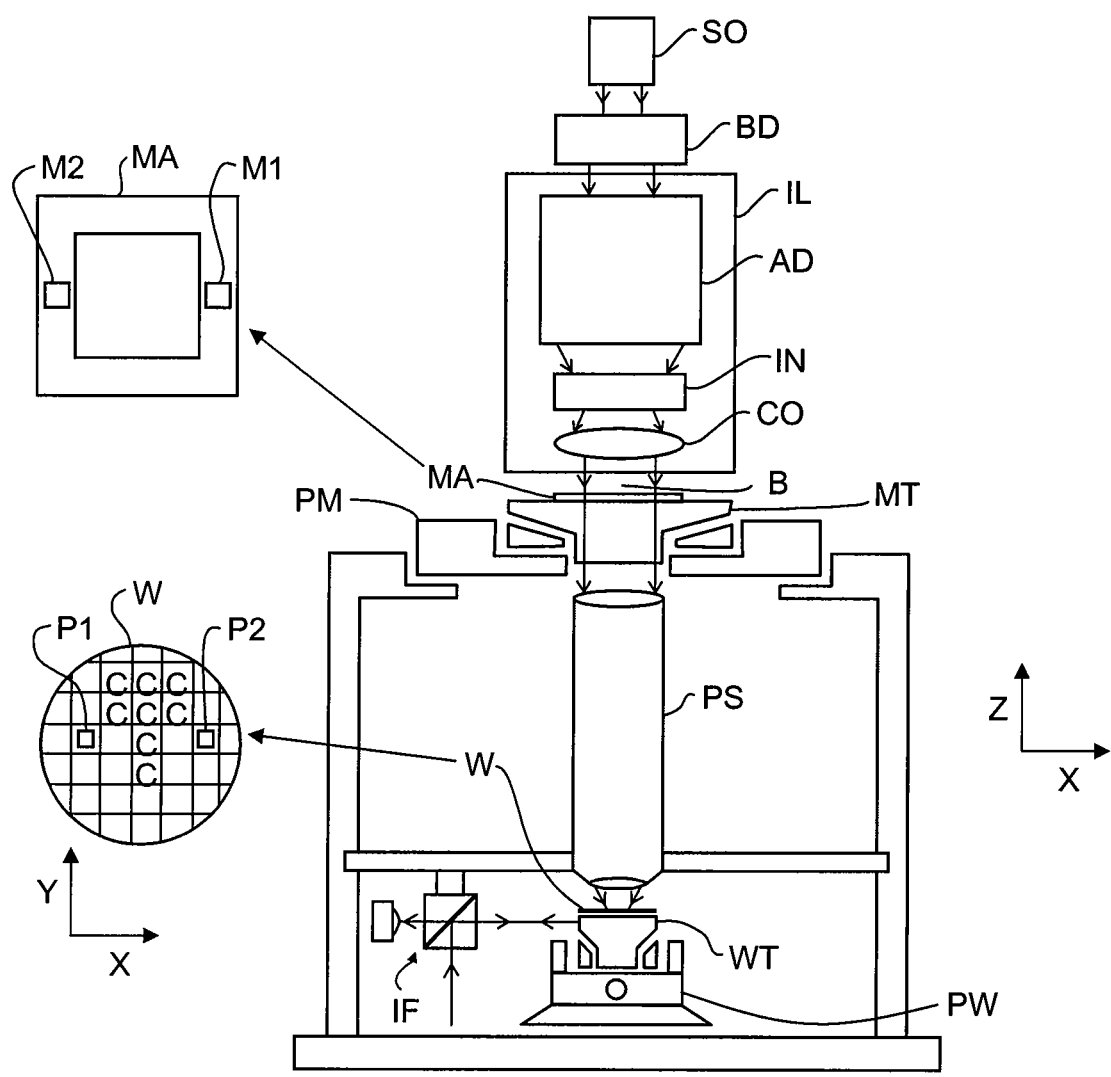
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or pattern support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or substrate support constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT may be moved accurately, e.g. so as to position different target portions C in the path of the radiation beam B. Similarly, the first positioning device PM and another position sensor (which is not explicitly depicted in FIG. 1) may be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C may be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
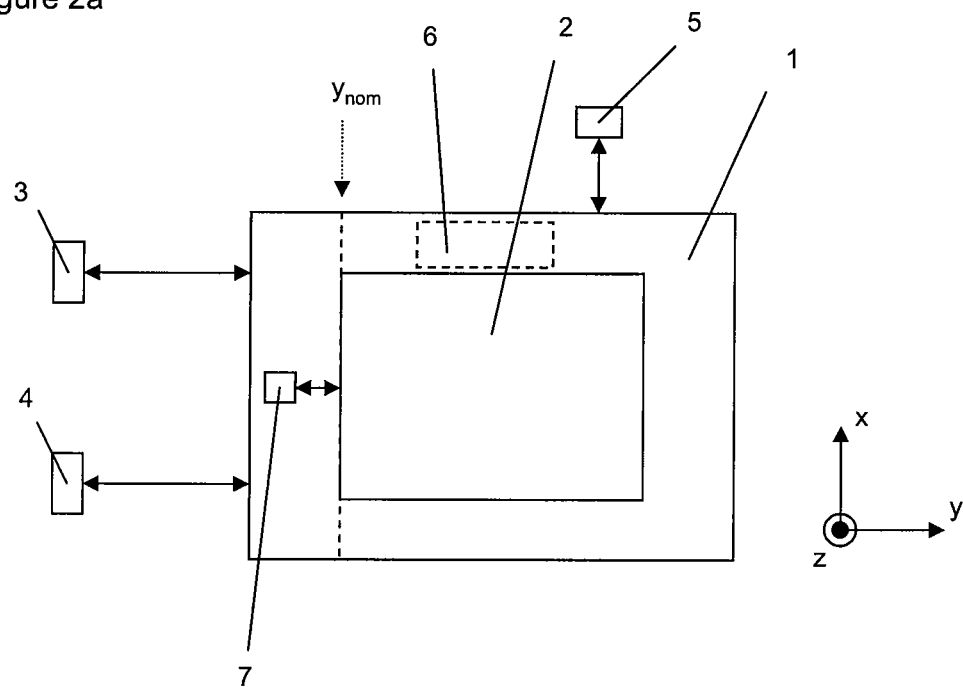
FIGS. 2a and 2b depict a movable support supporting an object.

FIG. 2a shows a top view of a movable support 1 and an object 2 supported by the movable support 1. For instance, the movable support 1 may be a patterning device support or substrate support and the object 2 a patterning device or a substrate, respectively. The movable support 1 is constructed to move in one or more directions with relatively high accelerations. The object 2 may be clamped on the movable support 1 by a clamping device, such as a vacuum, electrostatic, magnetic or electromagnetic clamping device (not shown).

In certain applications, in particular in lithographic apparatus, there is a continuously increasing demand on higher accuracy, in combination with higher throughput. To obtain a higher throughput, the accelerations of the movable support may be increased. However, the higher accelerations may require a higher clamping force to clamp the object 2 on the movable support 1. But even with high clamping force, it has been shown that for large accelerations, for instance above 10 G (micro)slip between the object and the movable support may occur. Furthermore, a high clamping force on the object and, in particular mechanical parts clamping or holding the object during acceleration may result in internal stresses and/or deformations of the movable object and are therefore undesirable. However, the avoidance of such mechanical parts increases the chance on the occurrence of slip between the object and the movable support.

In FIG. 2a, it is shown that the object is in the y-direction located at a nominal y-position $y_{nom}$ with respect to the movable support 1. This is for instance the position in which the object is located or assumed to be located during loading of the object 2. This position will normally be used to determine the set-point values of the movable support 1 which will be used to control the position of the movable support 1 and therewith the position of the object 2 supported by the movable support 1.

Figure 2B:
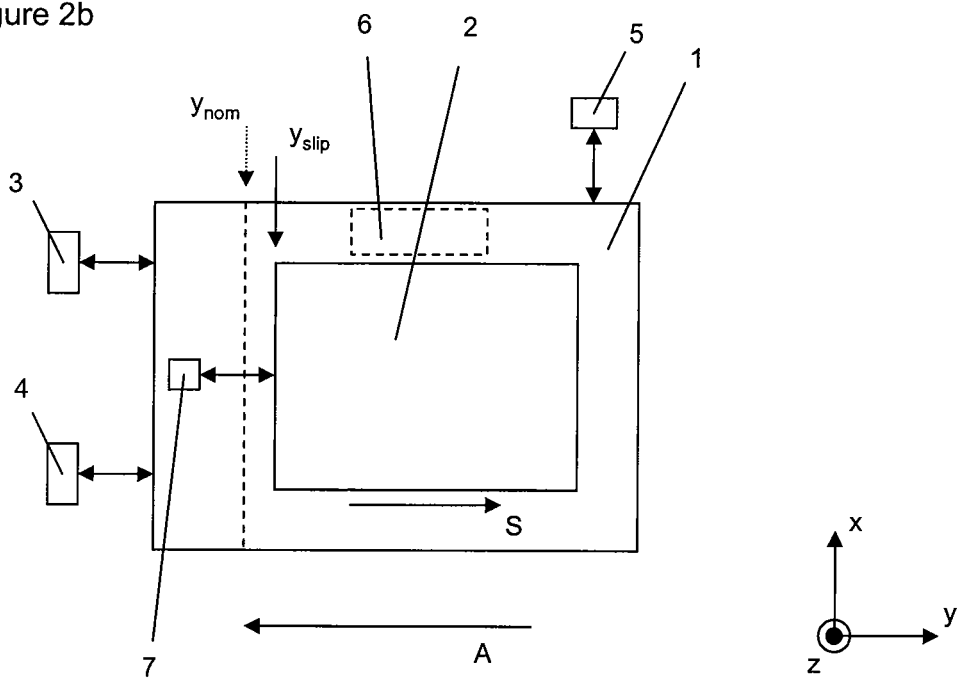

However, during acceleration in the y-direction as indicated with arrow A in FIG. 2b, slip may occur in the opposite direction as for instance indicated by the arrow S. In FIG. 2b is further shown that the movable object has moved from the nominal y position $y_{nom}$ to the y slip position $y_{slip}$ as a result of the slip between the object 2 and the movable support 1. The amount of slip, i.e. the difference between the y slip position $y_{slip}$ and the nominal position $y_{nom}$ may not be predicted with high accuracy since this difference may not be reproduced with high accuracy. It has been shown that the amount of slip which occurs between an object and movable support may vary even though the same accelerations are used.

Furthermore, it has been shown that in the case of a patterning device support carrying a patterning device, the slip may be more than 100 nm at acceleration levels up to 15 G. Such slip levels may lead to imaging errors such as focus and/or overlay errors in a lithographic apparatus.

A position measurement system to measure the position of the object support with respect to for instance a substantially stationary frame is provided. The position measurement system for measuring the movable support of FIGS. 2a and 2b includes two y-sensors 3, 4 and an x-sensor 5 to measure the position of the object support 1 in three coplanar degrees of freedom (x, y, Rz). This position measurement system may be used to measure the position of the movable support. In practice, the position measurement system may be any type of system suitable for measuring the actual position of the movable support, such as an interferometer measurement system or an encoder-type measurement system. The sensors of the system 3, 4 and 5 may be mounted on a frame or such, as shown in FIGS. 2a and 2b, but in alternative embodiments, the sensors may be mounted on the movable support and a sensor reference object such as mirror surfaces or encoder grids may be mounted on the frame.

An actuator 6 is provided to actuate the movable support to the desired position. This actuator 6 may be any suitable type of actuator configured to move the movable support with high precision in a desired direction. The actuator 6 may be configured to actuate the movable support in two or more degrees of freedom and/or two or more actuators may be provided to make movement in the required degrees of freedom possible. Such actuators are known in the art.

Figure 3:
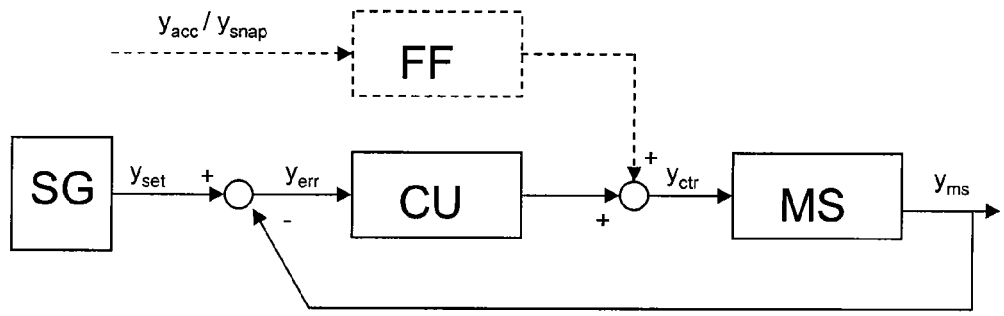
FIG. 3 depicts a conventional control scheme.

Now referring to FIG. 3, a prior art control scheme for a movable support is shown. The control scheme shows a set-point generator SG which is configured to generate a setpoint $y_{set}$ for the servo control system. The setpoint $y_{set}$ is the desired position of the object 2 supported on the movable support 1. However, the position of the object is controlled by actuation of the movable support 1, whereby it is assumed that the object remains in the same position, for instance the nominal position $y_{nom}$. In other words, it is assumed that no slip occurs between object and movable support.

The position of the movable support measured by the position measurement system $y_{ms}$ is compared by a comparative device with the setpoint $y_{set}$. The difference $y_{err}$, i.e. the error signal, between the setpoint $y_{set}$ and the actual position of the movable support $y_{ms}$ is fed into controller unit CU which may any suitable type of controller, for instance a PI or PID controller. The controller unit CU provides on the basis of the error signal $y_{err}$ a control signal $y_{ctr}$ which is fed to the actuator of the movable support MS.

In an embodiment a feed-forward unit FF may be provided (indicated with dashed lines) to provide a feed-forward signal on the basis of a setpoint or setpoint-dependent signal such as acceleration $y_{acc}$ or snap $y_{snap}$ or any other signal. The feed-forward signal is added to an addition device or adder to the control signal $y_{ctr}$.

With the prior art control scheme, the movable support is accurately positioned in a desired set-point. However, as explained above slip may occur between the movable support and the object supported by the movable support, in particular at high accelerations of the movable support. Due to slip, the object may not remain in the initial position, for instance the nominal position $y_{nom}$, with respect to the movable support. Thus, even though the movable support is positioned in the desired position, i.e. the error signal $y_{err}$ is zero, the object may not be positioned in the desired position, for instance misaligned with respect to another object. In a lithographic apparatus misalignment of a patterning device may lead to imaging errors such as overlay and/or focus errors.

In order to take the slip between the movable support 1 and the object 2 into account, a y-sensor 7 (see FIG. 2a and FIG. 2b) is provided on the movable support 1. The y-sensor 7 is configured to measure the position of the object 2 with respect to the movable support 1. Any type of suitable sensor may be used. A contactless sensor is preferred since contact between the sensor 7 and the object 1, may induce internal stresses and/or deformations in the object 2 during high accelerations. Such internal stresses and/or deformations may lead to misalignment of the object 2. For instance when the object is patterning device, the internal stresses and/or deformations may lead to focus and/or overlay errors. Suitable contactless sensors are for instance capacitive sensors. However, contact sensors may also be applied.

In the servo control system of an embodiment of the present invention, the $y_{slip}$ distance as measured by the y-sensor 7 is taken into account in order to compensate for the slip between the movable support 1 and the object 2.

Figure 4:
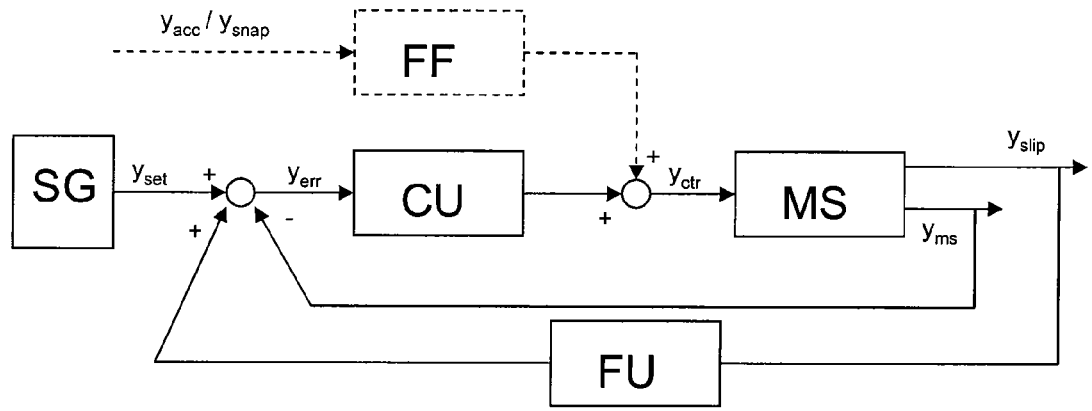
FIG. 4 depicts a control scheme according to an embodiment of the present invention.

In FIG. 4, a control scheme according to an embodiment of the present invention is shown. The control scheme of FIG. 4 includes a feedback loop in accordance with the prior art control scheme of FIG. 3. The measured position of a moveable support MS is measured and compared at a comparative device with a set-point generated by a set-point generator SG. The difference between the signal is fed to the controller unit CU.

However, different than in the prior art control scheme as shown in FIG. 3, a second position measurement signal $y_{slip}$ is also fed back and added to the signals at the comparative device. Thus, the error signal $y_{err}$ includes the setpoint $y_{set}$ plus the $y_{slip}$ signal minus the $y_{ms}$ signal.

In alternative embodiments, the $y_{slip}$ signal may not be added at the comparative device, but at another location using an addition device or adder. For instance, the $y_{slip}$ signal may be added to the position signal $y_{ms}$ measured by the movable support position measurement system, the setpoint $y_{set}$ or the error signal the error signal $y_{err}$.

By feeding back the position difference between the movable support 1 and the object 2, the movement of the object with respect to the movable support is taken into account. As a result, not the movable support 1, but the object 2 is correctly positioned when the error signal $y_{err}$ is zero. For instance in the example of a lithographic apparatus, the patterning device is correctly positioned with respect to the projection system instead of the patterning device support. As a result the overlay error which may result when slip occurs and the patterning device support is correctly positioned with respect to the projection system is prevented.

In an alternative embodiment, the $y_{slip}$ signal may not be added to the comparative device, but at another location using an addition device or adder. For instance, the $y_{slip}$ signal may be added to the position signal $y_{ms}$ measured by the movable support position measurement system, the setpoint $y_{set}$ or the error signal the error signal $y_{err}$.

In the feedback loop of the $y_{slip}$, a filter unit FU is provided to filter out high frequency disturbances. The filter unit FU is for instance a second order low pass filter.

Figure 5:
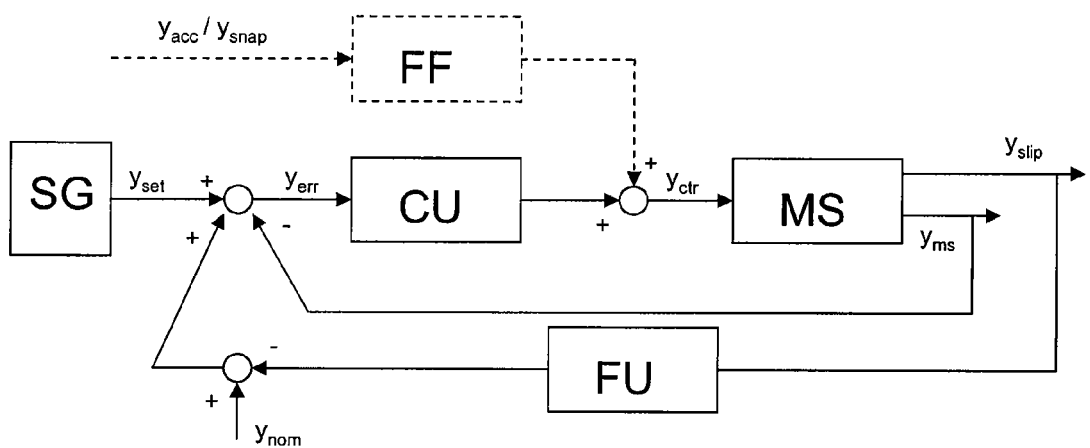
FIG. 5 depicts a control scheme according to an embodiment of the invention.

FIG. 5 shows another embodiment of a control scheme according to an embodiment of the invention. In this control scheme the $y_{slip}$ signal, as measured by the sensor 7, is subtracted from the nominal position of the object $y_{nom}$. The difference between the $y_{slip}$ signal and the $y_{nom}$ value is added to the setpoint signal, the $y_{ms}$ signal or the $y_{err}$ signal. In this embodiment, the setpoint $y_{set}$ generated by the setpoint generator SG is based on the nominal position $y_{nom}$ of the object. In the embodiment of FIG. 4, the setpoint are based on the desired location of the sensor.

Figure 6:
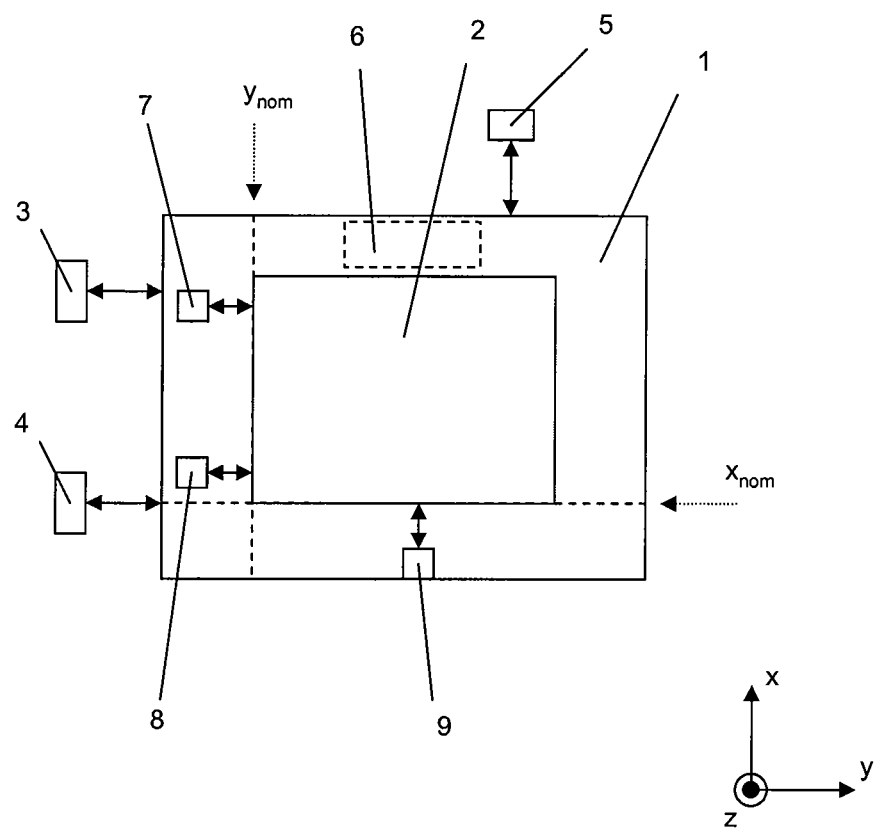
FIG. 6 depicts a movable support according to an embodiment of the invention.

FIG. 6 shows an alternative embodiment of a movable support 1 according to the invention. In the embodiment of FIGS. 2a and 2b, one y-sensor is provided to measure the change in position of the object with respect to the movable support due to slip. Such compensation is in particular useful when slip is only to be expected in the corresponding direction. When slip is to be expected in more than one direction, multiple sensors may be provided on the movable support to measure the position of the object 2 with respect to the movable support. In FIG. 6, three sensors are provided, two y-sensors 7, 8 and an x-sensor 9. With these sensors 7, 8 and 9, the movement of the object in three degrees of freedom (x, y, Rz) may be obtained. Each of these signals may be fed back to one or more actuators to move the movable support in such a way that the object is correctly positioned. In alternative embodiments more or less sensors may be provided for feedback of a compensation signal to take slip between a movable support and an object supported by such movable support into account in more or less degrees of freedom.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A servo control system configured to control a position of an object supported by a movable support, the servo control system comprising:

a first measurement system configured to measure a position of the movable support;

a comparative device configured to determine an error in the position of the movable support based on a comparison between the measured movable support position and a desired movable support position and to output an error signal indicative of the error in the position of the movable support;

a controller unit configured to provide a control signal based on the error signal;

a slip compensation device configured to compensate a slip between the object and the movable support, the slip compensation device comprising a second measurement system configured to measure a position of the object with respect to the movable support, and an adder configured to add a slip compensation signal to the measured movable support position or the error signal based on the measured object position; and an actuator configured to actuate the movable support based on the control signal to substantially simultaneously correct for the slip between the object and the movable support and the error in the position of the movable support.

2. The servo control system of claim 1, wherein the slip compensation signal is the measured object position.

3. The servo control system of claim 1, wherein the slip compensation signal is the difference between the measured object position and a nominal object position.

4. The servo control system of claim 3, wherein the servo control system comprises a filter unit configured to filter a signal corresponding to the position difference.

5. The servo control system of claim 1, wherein the filter unit comprises a second order low-pass filter.

6. The servo control system of claim 1, wherein the second measurement system comprises a sensor mounted on the movable support.

7. The servo control system of claim 6, wherein the sensor is a capacitive sensor.

8. The servo control system of claim 6, wherein the sensor is a contactless sensor.

9. The servo control system of claim 1, wherein the second measurement system comprises a first position sensor and a second position sensor, the first and second position sensors configured to measure the position difference in a first direction, the first and second position sensors being spaced in a direction perpendicular to the first direction.

10. The servo control system of claim 9, wherein the second measurement system comprises a third position sensor configured to measure the position difference in a second direction perpendicular to the first direction.

11. A lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate table constructed to hold a substrate;
a projection system configured to project the patterned radiation beam onto a target portion of the substrate, and
a servo control system configured to control a position of an object supported by a movable support, the servo control system comprising:

a first measurement system configured to measure a position of the movable support;

a comparative device configured to determine an error in the position of the movable support based on a comparison between the measured movable support position and a desired movable support position and to output an error signal indicative of the error in the position of the movable support;

a controller unit configured to provide a control signal based on the error signal;

a slip compensation device configured to compensate a slip between the object and the movable support, the slip compensation device comprising a second measurement system configured to measure a position of the object with respect to the movable support, and an adder configured to add a slip compensation signal to the measured movable support position or the error signal based on the measured object position; and an actuator configured to actuate the movable support based on the control signal to substantially simultaneously correct for the slip between the object and the movable support and the error in the position of the movable support.

12. The lithographic apparatus of claim 11, wherein the object is the patterning device and the movable support is the patterning device support.

13. The lithographic apparatus of claim 11, wherein the object is the substrate and the movable support is the substrate table.

14. A method for controlling the position of an object supported by a movable support, comprising:
measuring a position of the movable support;
subtracting the measured movable support position from a desired movable support position to provide an error signal indicative of an error in the position of the movable support;
compensating for a slip between the object and the movable support, the compensating comprising:
measuring an object position of the object with respect to the movable support;
generating a slip compensation signal indicative of the measured position of the object, and
adding the slip compensation signal to the measured movable support position or the error signal based on the measured object position to generate a compensation signal;
supplying the compensation signal to a control unit, the control unit providing a control signal based on the compensation signal;
supplying the control signal to an actuator configured to actuate the movable support; and
actuating the movable support based on the compensation signal to substantially simultaneously correct for the slip between the object and the movable support and the error in the position of the movable support.

15. The method of claim 14, wherein the object position is measured in two directions.

16. The method of claim 14, wherein the slip compensation signal is the measured object position.

17. The method of claim 14, wherein the slip compensation signal is the difference between the measured object position and a nominal object position.

* * * * *